(12) United States Patent
Priewasser

(10) Patent No.: US 12,094,751 B2
(45) Date of Patent: Sep. 17, 2024

(54) METHOD OF PROCESSING A SUBSTRATE

(71) Applicant: DISCO CORPORATION, Tokyo (JP)

(72) Inventor: Karl Heinz Priewasser, Munich (DE)

(73) Assignee: DISCO CORPORATION, Tokyo (JP)

( * ) Notice: Subject to any disclaimer, the term of this patent is extended or adjusted under 35 U.S.C. 154(b) by 276 days.

(21) Appl. No.: 17/819,672

(22) Filed: Aug. 15, 2022

(65) Prior Publication Data
US 2023/0072652 A1    Mar. 9, 2023

(30) Foreign Application Priority Data

Sep. 9, 2021    (DE) ..................... 10 2021 209 979.3

(51) Int. Cl.
H01L 21/02    (2006.01)
H01L 21/683    (2006.01)

(52) U.S. Cl.
CPC .... *H01L 21/6836* (2013.01); *H01L 21/02016* (2013.01); *H01L 2221/68327* (2013.01); *H01L 2221/6834* (2013.01)

(58) Field of Classification Search
None
See application file for complete search history.

(56) References Cited

U.S. PATENT DOCUMENTS

| | | |
|---|---|---|
| 2012/0322233 A1 | 12/2012 | Lei et al. |
| 2015/0332928 A1 | 11/2015 | Priewasser |
| 2016/0266037 A1* | 9/2016 | Ryo .................. G01N 21/8422 |
| 2017/0062278 A1 | 3/2017 | Priewasser |
| 2018/0247870 A1 | 8/2018 | Priewasser |
| 2019/0252254 A1 | 8/2019 | Priewasser et al. |
| 2021/0183704 A1 | 6/2021 | Priewasser |

FOREIGN PATENT DOCUMENTS

| | | |
|---|---|---|
| DE | 102018200656 A1 | 7/2019 |
| JP | 2015149385 A | 8/2015 |
| JP | 2017050536 A | 3/2017 |
| JP | 2017059766 A | 3/2017 |
| JP | 2018526826 A | 9/2018 |
| JP | 2021027336 A | 2/2021 |

\* cited by examiner

*Primary Examiner* — Shamim Ahmed
(74) *Attorney, Agent, or Firm* — Greer Burns & Crain Ltd.

(57) ABSTRACT

Methods of processing a substrate having one side and an opposite side include providing a protective film having a front surface and a back surface, and applying a water-soluble material to at least a central area of the front surface of the protective film and/or applying a water-soluble material to at least a central portion of the one side of the substrate. The protective film is applied to the one side of the substrate, wherein the front surface of the protective film faces the one side of the substrate and no adhesive is between at least the central area of the front surface of the protective film and the one side of the substrate. An external stimulus is applied to the protective so that the protective film is attached to the one side of the substrate, and the substrate can be processed.

8 Claims, 4 Drawing Sheets

METHOD OF PROCESSING A SUBSTRATE

TECHNICAL FIELD

The present invention relates to methods of processing a substrate, such as a wafer, having one side and a side being opposite to the one side.

TECHNICAL BACKGROUND

The processing of a substrate, such as a wafer, commonly has to be performed with a high degree of efficiency and reliability. For example, in a device fabrication process, e.g., for producing semiconductor devices, a substrate, such as a wafer, having a device area with a plurality of devices, commonly partitioned by a plurality of division lines, is divided into individual dies. This fabrication process generally comprises a grinding step for adjusting the substrate thickness and a cutting step of cutting the substrate along the division lines to obtain the individual dies. The grinding step is performed from a back side of the substrate which is opposite to a substrate front side on which the device area is formed. Moreover, also other processing steps, such as polishing and/or etching, may be carried out on the back side of the substrate. The substrate may be cut along the division lines from its front side or its back side.

In order to protect the devices formed on the substrate, e.g., from breakage, deformation and/or contamination by debris, grinding water or cutting water, during processing of the substrate, a protective film or sheeting may be applied to the front side of the substrate prior to processing.

Such protection of the devices is particularly important if the device area has an uneven surface structure. For example, in known semiconductor device fabrication processes, such as Wafer Level Chip Scale Package (WLCSP), the device area of the substrate is formed with a plurality of protrusions, such as bumps, protruding from a plane surface of the substrate. These protrusions are used, for example, for establishing an electrical contact with the devices in the individual dies, e.g., when incorporating the dies in electronic equipment, such as mobile phones and personal computers.

In order to achieve a size reduction of such electronic equipment, the semiconductor devices have to be reduced in size. Hence, substrates having the devices formed thereon are ground in the grinding step referred to above to thicknesses in the μm range, e.g., in the range from 20 to 100 μm.

In known semiconductor device fabrication processes, problems may arise during processing, e.g., in the grinding step, if protrusions, such as bumps, are present in the device area. In particular, due to the presence of these protrusions, the risk of breakage of the substrate during processing is significantly increased. Further, if the substrate is ground to a small thickness, e.g., a thickness in the μm range, the protrusions of the device area on the front side of the substrate may cause a deformation of the substrate back side, thus compromising the quality of the resulting dies.

Therefore, the use of a protective film or sheeting is of particular importance when processing substrates with device areas having such uneven surface structures.

However, in particular, for the case of sensitive devices, such as micro-electro-mechanical systems (MEMS), there is a problem in that the device structure on the substrate may be damaged by the adhesive force of an adhesive layer formed on the protective film or sheeting or may be contaminated by adhesive residues on the devices, when the film or sheeting is peeled off from the substrate.

A protective film or sheeting may be applied to the back side of the substrate prior to processing, in order to protect the substrate, e.g., from breakage, deformation and/or contamination by debris, for example, during a step of cutting the substrate.

Also in this case, there is a problem that the substrate may be damaged by the adhesive force of an adhesive layer formed on the protective film or sheeting or may be contaminated by adhesive residues on the substrate, when the film or sheeting is peeled off from the substrate.

In order to address this issue, it has been proposed in DE 10 2018 200 656 A1 to apply a protective film to a wafer so that at least a central area of the protective film is in direct contact with the wafer. An attachment force between protective film and wafer, holding the protective film in its position on the wafer, is generated through the application of an external stimulus. However, while in this way, adhesive residues on the wafer are avoided, it cannot be excluded that residues of the protective film material may remain on the substrate after peeling off the protective film. Further, for the case of a strong attachment force between protective film and wafer, the protective film may be difficult to peel off from the wafer.

Hence, there remains a need for a reliable and efficient method of processing a substrate which allows for any risk of contamination of and damage to the substrate to be minimised.

SUMMARY OF THE INVENTION

Accordingly, it is an object of the present invention to provide a reliable and efficient method of processing a substrate which allows for any risk of contamination of and damage to the substrate to be minimised. This goal is achieved by a substrate processing method with the technical features of claim 1 and by a substrate processing method with the technical features of claim 2. Preferred embodiments of the invention follow from the dependent claims.

The invention provides, according to a first aspect, a method of processing a substrate, having one side and a side being opposite to the one side. The method comprises providing a protective film having a front surface and a back surface opposite to the front surface, and applying a coating of a water-soluble material to at least a central area of the front surface of the protective film and/or applying a coating of a water-soluble material to at least a central portion of the one side of the substrate. The method further comprises, after applying the coating to the protective film and/or applying the coating to the substrate, applying the protective film to the one side of the substrate, wherein the front surface of the protective film faces the one side of the substrate and the protective film is applied so that no adhesive is present between at least the central area of the front surface of the protective film and the one side of the substrate. Moreover, the method comprises applying an external stimulus to the protective film during and/or after applying the protective film to the one side of the substrate, so that the protective film is attached to the one side of the substrate, and processing the one side of the substrate and/or the side of the substrate being opposite to the one side.

The protective film is applied to the one side of the substrate so that no adhesive is present between at least the central area of the front surface of the protective film and the one side of the substrate. Therefore, the risk of a possible contamination of or damage to the substrate, e.g., due to an adhesive force of an adhesive layer or adhesive residues on the substrate, can be significantly reduced or even eliminated. No adhesive may be present between the front surface of the protective film and at least the central portion of the one side of the substrate.

During and/or after applying the protective film to the one side of the substrate, the external stimulus is applied to the protective film, so that the protective film is attached to the one side of the substrate. An attachment force between protective film and substrate, holding the protective film in its position on the substrate, is thus generated through the application of the external stimulus. Hence, no additional adhesive material is necessary for attaching the protective film to the one side of the substrate.

In particular, by applying the external stimulus to the protective film, a form fit, such as a positive fit, and/or a material bond, such as an adhesive bond, may be formed between the protective film and the substrate. The terms "material bond" and "adhesive bond" define an attachment or connection between protective film and substrate due to atomic and/or molecular forces acting between these two components.

The term "adhesive bond" relates to the presence of these atomic and/or molecular forces, which act so as to attach or adhere the protective film to the substrate, and does not imply the presence of an additional adhesive between protective film and substrate. Rather, no adhesive is present between at least the central area of the front surface of the protective film and the one side of the substrate, as has been detailed above.

Before applying the protective film to the one side of the substrate, a coating of a water-soluble material is applied to at least the central area of the front surface of the protective film and/or to at least the central portion of the one side of the substrate. The coating of the water-soluble material may be applied only to at least the central area of the front surface of the protective film. The coating of the water-soluble material may be applied only to at least the central portion of the one side of the substrate. The coating of the water-soluble material may be applied to at least the central area of the front surface of the protective film and to at least the central portion of the one side of the substrate.

The central area of the front surface of the protective film may correspond to the central portion of the one side of the substrate. The central area of the front surface of the protective film may be congruent with the central portion of the one side of the substrate.

The coating of the water-soluble material may be applied to the entire front surface of the protective film. The coating of the water-soluble material may be applied to the entire portion of the front surface of the protective film which comes into contact with the one side of the substrate. The coating of the water-soluble material may be applied to the entire one side of the substrate. The coating of the water-soluble material may be applied to the entire portion of the one side of the substrate which comes into contact with the front surface of the protective film.

The water-soluble material is not an adhesive. No adhesive is present between at least the central area of the front surface of the protective film and the one side of the substrate, as has been detailed above.

By providing the coating of the water-soluble material between protective film and substrate at least in the central area or portion, removal of the protective film from the substrate is significantly facilitated. In particular, the water-soluble material can lower the peeling force required for peeling off the protective film. Hence, the risk of any damage to the substrate in the process of removing the protective film therefrom is reduced even further.

Moreover, due to this presence of the water-soluble material, the risk of any residues of the protective film material remaining on the substrate after removal of the protective film is minimised. If residues of the water-soluble material remain on the substrate after protective film removal, such residues can be removed in a simple, reliable and efficient manner by cleaning the one side of the substrate with water, due to the water-soluble nature of the material.

By applying the coating of the water-soluble material to the protective film, a particularly complete and homogeneous coating can be achieved. Further, the coating can be inspected in an especially simple, reliable and efficient manner, e.g., by visual inspection.

The method of the first aspect of the present invention thus enables reliable and efficient processing of a substrate, minimising any risk of contamination of and damage to the substrate.

The invention further provides, according to a second aspect, a method of processing a substrate, having one side and a side being opposite to the one side. The method comprises providing a protective film having a front surface and a back surface opposite to the front surface, wherein the protective film has a coating of a water-soluble material applied to at least a central area of the front surface of the protective film, and applying the protective film to the one side of the substrate, wherein the front surface of the protective film faces the one side of the substrate and the protective film is applied so that no adhesive is present between at least the central area of the front surface of the protective film and the one side of the substrate. The method further comprises applying an external stimulus to the protective film during and/or after applying the protective film to the one side of the substrate, so that the protective film is attached to the one side of the substrate, and processing the one side of the substrate and/or the side of the substrate being opposite to the one side.

The protective film may be provided with the coating of the water-soluble material in advance, e.g., during or shortly after manufacture of the protective film.

The substrate processing method according to the second aspect provides the technical effects and advantages already described in detail above for the substrate processing method according to the first aspect.

The features described above for the substrate processing method according to the first aspect also apply to the substrate processing method according to the second aspect. In particular, the substrate, the protective film, the water-soluble material and the external stimulus may be the same as described above.

Thus, also the method of the second aspect of the present invention enables reliable and efficient processing of a substrate, minimising any risk of contamination of and damage to the substrate.

The following features, definitions, technical effects and advantages apply to the methods according to the first and second aspects.

The one side of the substrate may be a front side or a back side of the substrate. The side of the substrate being opposite to the one side may be a front side or a back side of the substrate.

The one side or surface of the substrate and the side or surface of the substrate being opposite to the one side or surface may be substantially parallel to each other.

The substrate may be, for example, made of a semiconductor, glass, sapphire ($Al_2O_3$), a ceramic, such as an alumina ceramic, quartz, zirconia, PZT (lead zirconate titanate), a polycarbonate, an optical crystal material or the like.

In particular, the substrate may be, for example, made of silicon carbide (SiC), silicon (Si), gallium arsenide (GaAs), gallium nitride (GaN), gallium phosphide (GaP), indium arsenide (InAs), indium phosphide (InP), silicon nitride (SiN), lithium tantalate (LT), lithium niobate (LN), aluminium nitride (AlN), silicon oxide ($SiO_2$) or the like.

The substrate may be a single crystal substrate, a glass substrate, a compound substrate, such as a compound semiconductor substrate, e.g., a SiC, SiN, GaN or GaAs substrate, or a polycrystalline substrate, such as a ceramic substrate.

The substrate may be a wafer. For example, the substrate may be a semiconductor-sized wafer. Herein, the term "semiconductor-sized wafer" refers to a wafer with the dimensions (standardised dimensions), in particular, the diameter (standardised diameter), i.e., outer diameter, of a semiconductor wafer. The dimensions, in particular, the diameters, i.e., outer diameters, of semiconductor wafers are defined in the SEMI standards. For example, the dimensions of polished single crystal silicon (Si) wafers are defined in the SEMI standards M1 and M76. The semiconductor-sized wafer may be a 3 inch, 4 inch, 5 inch, 6 inch, 8 inch, 12 inch or 18 inch wafer.

The substrate may be a semiconductor wafer. For example, the substrate may be made of any of the semiconductor materials given above.

The substrate, such as a wafer, may be made of a single material or of a combination of different materials, e.g., two or more of the above-identified materials. For example, the substrate may be a Si and glass bonded wafer in which a wafer element made of Si is bonded to a wafer element made of glass.

The substrate may have any type of shape. In a top view thereon, the substrate may have, for example, a circular shape, an oval shape, an elliptical shape or a polygonal shape, such as a rectangular shape or a square shape.

The substrate may have, on the one side and/or on the side being opposite to the one side, a device area with a plurality of devices. The side of the substrate having the device area may be the front side of the substrate.

The devices in the device area may be, for example, semiconductor devices, power devices, optical devices, medical devices, electrical components, MEMS devices or combinations thereof. The devices may comprise or be, for example, transistors, such as MOSFETs or insulated-gate bipolar transistors (IGBTs), or diodes, e.g., Schottky barrier diodes.

The substrate may further have, on the side of the substrate having the device area, a peripheral marginal area having no devices and being formed around the device area.

One or more division lines may be formed on the one side of the substrate and/or on the side of the substrate being opposite to the one side. If the substrate has, on the one side of the substrate and/or on the side of the substrate being opposite to the one side, a device area with a plurality of devices, the devices may be partitioned by the one or more division lines. The width of the one or more division lines may be in the range of 30 μm to 200 μm, preferably 30 μm to 150 μm and more preferably 30 μm to 100 μm.

The protective film may be applied to the one side of the substrate so as to cover the devices formed in the device area and thus protect the devices, e.g., from contamination and damage.

The surface of the one side of the substrate may be a substantially flat, even surface or a flat, even surface. Alternatively, protrusions or projections protruding from a plane substrate surface along a thickness direction of the substrate and/or recesses, recessed from a plane substrate surface along the thickness direction of the substrate, may be present on the one side of the substrate. The thickness direction of the substrate extends from the one side of the substrate towards the side of the substrate being opposite to the one side.

Applying the external stimulus to the protective film may consist of or comprise heating the protective film and/or cooling the protective film and/or applying pressure to the protective film and/or applying a vacuum to the protective film and/or irradiating the protective film with radiation, such as light or UV radiation, e.g., by using a laser beam.

The external stimulus may comprise or be a chemical compound and/or electron or plasma irradiation and/or mechanical treatment, such as vacuum, pressure, friction or ultrasound application, and/or static electricity.

Particularly preferably, applying the external stimulus to the protective film consists of or comprises heating the protective film. For example, applying the external stimulus to the protective film may consist of or comprise heating the protective film and applying a vacuum to the protective film. In this case, the vacuum may be applied to the protective film during and/or before and/or after heating the protective film.

If applying the external stimulus to the protective film consists of or comprises heating the protective film, the method may further comprise allowing the protective film to cool down after the heating process. In particular, the protective film may be allowed to cool down to its initial temperature, i.e., to the temperature thereof prior to the heating process. The protective film may be allowed to cool down, e.g., to its initial temperature, before processing the one side of the substrate and/or the side of the substrate being opposite to the one side.

An attachment force between protective film and substrate is generated through the heating process. The attachment of the protective film to the substrate may be caused in the heating process itself and/or in a subsequent process of allowing the protective film to cool down.

The protective film may be softened by the heating process, e.g., so as to conform to the substrate surface on the one side of the substrate, for example, absorbing the substrate topography. Upon cooling down, e.g., to its initial temperature, the protective film may reharden, e.g., so as to create a form fit and/or a material bond to the substrate.

The protective film may be heat resistant up to a temperature of 180° C. or more, preferably up to a temperature of 220° C. or more, more preferably up to a temperature of 250° C. or more, and even more preferably up to a temperature of 300° C. or more.

The protective film may be heated to a temperature in the range of 30° C. to 250° C., preferably 50° C. to 200° C., more preferably 60° C. to 150° C. and even more preferably 70° C. to 110° C. Particularly preferably, the protective film is heated to a temperature of approximately 80° C.

The protective film may be heated over a duration in the range of 30 sec to 10 min, preferably 1 min to 8 min, more preferably 1 min to 6 min, even more preferably 1 min to 4 min and yet more preferably 1 min to 3 min, during and/or after applying the protective film to the one side of the substrate.

If applying the external stimulus to the protective film consists of or comprises heating the protective film, the protective film may be directly and/or indirectly heated.

The protective film may be heated by directly applying heat thereto, e.g., using a heat application means, such as a heated roller, a heated stamp or the like, or a heat radiation means. The protective film and the substrate may be placed in a receptacle or chamber, such as a vacuum chamber, and an inner volume of the receptacle or chamber may be heated, so as to heat the protective film. The receptacle or chamber may be provided with a heat radiation means.

The protective film may be indirectly heated, e.g., by heating the substrate before and/or during and/or after applying the protective film to the one side of the substrate. For example, the substrate may be heated by placing the substrate on a support or carrier, such as a chuck table, and heating the support or carrier.

For example, the support or carrier, such as a chuck table, may be heated to a temperature in the range of 30° C. to 250° C., preferably 50° C. to 200° C., more preferably 60° C. to 150° C. and even more preferably 70° C. to 110° C. Particularly preferably, the support or carrier may be heated to a temperature of approximately 80° C.

These approaches may also be combined, for example, by using a heat application means, such as a heated roller or the like, or a heat radiation means for directly heating the protective film, and also indirectly heating the protective film through the substrate.

If applying the external stimulus to the protective film consists of or comprises heating the protective film, it is preferable that the protective film is pliable, elastic, flexible, stretchable, soft and/or compressible when in its heated state. In this way, it can be particularly reliably ensured that the protective film conforms to the substrate surface on the one side of the substrate, for example, absorbing the substrate topography. This is especially advantageous if protrusions, such as surface unevenness or roughness, bumps, optical elements or the like, protruding along the thickness direction of the substrate, and/or recesses, recessed along the thickness direction of the substrate, are present on the one side of the substrate.

Preferably, the protective film, at least to some degree, hardens or stiffens upon cooling down, so as to become more rigid and/or robust in the cooled down state. In this way, particularly reliable protection of the substrate during subsequent processing of the substrate can be ensured.

The method may further comprise, during and/or after applying the protective film to the one side of the substrate, applying pressure to the back surface of the protective film. In this way, the front surface of the protective film is pressed against the one side of the substrate. Thus, it can be particularly efficiently ensured that the protective film is reliably attached to the substrate.

If applying the external stimulus to the protective film comprises heating the protective film, the pressure may be applied to the back surface of the protective film before and/or during and/or after heating the protective film. The pressure may be applied to the back surface of the protective film before processing the one side of the substrate and/or the side of the substrate being opposite to the one side.

The pressure may be applied to the back surface of the protective film by a pressure application means, such as a roller, a stamp, a membrane or the like.

Particularly preferably, a combined heat and pressure application means, such as a heated roller or a heated stamp, may be used. In this case, pressure can be applied to the back surface of the protective film while, at the same time, heating the protective film.

The pressure may be applied to the back surface of the protective film in a vacuum chamber, as will be further detailed below.

The protective film may be applied and/or attached to the one side of the substrate in a reduced pressure atmosphere, in particular, under a vacuum. In this way, it can be reliably ensured that no voids and/or air bubbles are present between the protective film and the substrate. Hence, any stress or strain on the substrate during processing thereof, e.g., due to such air bubbles expanding in the heating process, is avoided.

For example, the step or steps of applying and/or attaching the protective film to the one side of the substrate may be carried out in a vacuum chamber. In particular, the protective film may be applied and/or attached to the one side of the substrate by using a vacuum laminator. In such a vacuum laminator, the substrate is placed on a chuck table in a vacuum chamber in a state in which the side of the substrate being opposite to the one side is in contact with an upper surface of the chuck table and the one side of the substrate is oriented upward. The chuck table may be, for example, a heated chuck table.

The protective film to be applied to the one side of the substrate is held at its peripheral portion by an annular frame and placed above the one side of the substrate in the vacuum chamber. An upper part of the vacuum chamber which is situated above the chuck table and the annular frame is provided with an air inlet port closed by an expandable rubber membrane.

After the substrate and the protective film have been loaded into the vacuum chamber, the chamber is evacuated and air is supplied through the air inlet port to the rubber membrane, causing the rubber membrane to expand into the evacuated chamber. In this way, the rubber membrane is moved downward in the vacuum chamber so as to push the protective film against the one side of the substrate, sealing the peripheral substrate portion with the protective film and pressing the film against the one side of the substrate. Hence, the protective film can be applied closely to the one side of the substrate, e.g., so as to follow the contours of protrusions or projections, if such protrusions or projections are present.

The protective film may be heated during and/or after application thereof to the one side of the substrate, e.g., by heating the chuck table.

Subsequently, the vacuum in the vacuum chamber is released and the protective film is held in its position on the one side of the substrate by the attachment force generated through the heating process and the positive pressure in the vacuum chamber.

Alternatively, the rubber membrane can be replaced by a soft stamp or a soft roller, e.g., a heated soft stamp or a heated soft roller.

The protective film may have any type of shape. In a top view thereon, the protective film may have, for example, a circular shape, an oval shape, an elliptical shape or a polygonal shape, such as a rectangular shape or a square shape.

The protective film may have substantially the same shape or the same shape as the substrate.

The protective film may have an outer diameter which is larger than an outer diameter of the substrate. In this way, processing, handling and/or transport of the substrate can be facilitated. In particular, an outer peripheral portion of the protective film can be attached to an annular frame, as will be detailed below.

The protective film may have an outer diameter which is smaller than the outer diameter of the substrate.

The protective film may have an outer diameter which is substantially the same as the outer diameter of the substrate.

The protective film may have an outer diameter which is substantially the same as or larger than the outer diameter of a device area of the substrate.

The method may further comprise cutting the protective film. The protective film may be cut so that it has an outer diameter which is larger than the outer diameter of the substrate or smaller than the outer diameter of the substrate or substantially the same as the outer diameter of the substrate. The protective film may be cut so that it has an outer diameter which is substantially the same as or larger than the outer diameter of a device area of the substrate.

The step of cutting the protective film may be performed before or after applying the protective film to the substrate.

The step of cutting the protective film may be performed before or after attaching the protective film to the substrate.

The method may further comprise attaching an outer peripheral portion of the protective film to an annular frame. In particular, the outer peripheral portion of the protective film may be attached to the annular frame so that the protective film closes a central opening of the annular frame, i.e., the area inside the inner diameter of the annular frame. In this way, the substrate, which is attached to the protective film, in particular, to a central portion thereof, is held by the annular frame through the protective film. Thus, a substrate unit, comprising the substrate, the protective film and the annular frame, is formed, facilitating processing, handling and/or transport of the substrate.

The step of attaching the outer peripheral portion of the protective film to the annular frame may be performed before or after applying the protective film to the substrate.

The step of attaching the outer peripheral portion of the protective film to the annular frame may be performed before or after attaching the protective film to the substrate.

The step of attaching the outer peripheral portion of the protective film to the annular frame may be performed before or after processing the one side of the substrate and/or the side of the substrate being opposite to the one side.

The protective film may be applied to the one side of the substrate so that, in the entire region where the front surface of the protective film is in contact with the one side of the substrate, no adhesive is present between the front surface of the protective film and the one side of the substrate.

In this way, the risk of a possible contamination of or damage to the substrate, e.g., due to an adhesive force of an adhesive layer or adhesive residues on the substrate, can be reliably eliminated.

The entire front surface of the protective film may be free of adhesive.

Alternatively, the protective film may be provided with an adhesive layer, wherein the adhesive layer is provided only in a peripheral area of the front surface of the protective film, the peripheral area surrounding the central area of the front surface of the protective film, and the protective film is applied to the one side of the substrate so that the adhesive layer comes into contact only with a peripheral portion of the one side of the substrate. The peripheral portion of the one side of the substrate may surround the central portion of the one side of the substrate. The peripheral portion of the one side of the substrate may correspond to or be the peripheral marginal area of the substrate, if present.

By providing the protective film with an adhesive layer only in the peripheral area of the front surface of the protective film, the attachment of the protective film to the substrate can be further improved. Since the adhesive layer is provided only in the peripheral area of the front surface of the protective film, the area in which protective film and substrate are attached to each other by the adhesive layer is significantly reduced as compared to a case where an adhesive layer is provided on the entire front surface of the protective film. Thus, the protective film can be detached from the substrate more easily and the risk of damage to the substrate, in particular, to protrusions formed on the one side thereof, is considerably reduced.

The adhesive of the adhesive layer may be curable by an external stimulus, such as heat, UV radiation, an electric field and/or a chemical agent. In this way, the protective film can be particularly easily removed from the substrate after processing. The external stimulus may be applied to the adhesive so as to lower the adhesive force thereof, thus allowing for an easy removal of the protective film.

For example, the adhesive layer may have a substantially annular shape, an open rectangular shape or an open square shape, i.e., a rectangular or square shape, respectively, with an opening in the centre of the adhesive layer.

The protective film may be expandable. The protective film may be expanded when being applied to the one side of the substrate. If protrusions are present on the one side of the substrate, the protective film may be expanded when being applied to the one side of the substrate so as to closely or at least partly follow the contours of these protrusions.

In particular, the protective film may be expandable to twice its original size or more, preferably three times its original size or more and more preferably four times its original size or more. In this way, in particular, for the case of an expansion to three or four times its original size or more, it can be reliably ensured that the protective film follows the contours of the protrusions.

The protective film is configured to protect the one side of the substrate, in particular, during processing the one side of the substrate and/or the side of the substrate being opposite to the one side.

The protective film may be made of a single material, in particular, a single homogeneous material. The protective film may be, for example, a sheet or a foil.

The protective film may be made of a plastic material, such as a polymer. Particularly preferably, the protective film is made of a polyolefin. For example, the protective film may be made of polyethylene (PE), polypropylene (PP) or polybutylene (PB).

Polyolefin films have material properties which are especially advantageous for use in the substrate processing methods of the present invention, in particular, if applying the external stimulus to the protective film consists of or comprises heating the protective film. Polyolefin films are pliable, stretchable and soft when in a heated state, e.g., when heated to a temperature in the range of 60° C. to 150° C. Thus, it can be particularly reliably ensured that the protective film conforms to the substrate surface on the one side of the substrate, for example, absorbing the substrate topography. This is particularly beneficial if the one side of the substrate is formed with protrusions or projections protruding from a plane surface of the substrate.

Further, polyolefin films harden and stiffen upon cooling down, so as to become more rigid and robust in the cooled down state. Hence, particularly reliable protection of the substrate during subsequent processing thereof can be ensured.

The protective film may have a thickness in the range of 5 to 500 µm, preferably 5 to 200 µm, more preferably 8 to 100 µm, even more preferably 10 to 80 µm and yet even more preferably 12 to 50 µm. Particularly preferably, the protective film has a thickness in the range of 80 to 150 µm.

In this way, it can be particularly reliably ensured that the protective film is flexible and pliable enough to sufficiently conform to the contours of protrusions formed on the one side of the substrate, if such protrusions are present, and, at the same time, exhibits a sufficient thickness in order to reliably and efficiently protect the substrate during processing thereof.

A cushioning layer may be attached to the back surface of the protective film. A front surface of the cushioning layer may be attached to the back surface of the protective film.

This approach is particularly advantageous, if protrusions or projections, such as surface unevenness or roughness, bumps, optical elements, e.g., optical lenses, other structures or the like, protrude, extend or project from the one side of the substrate along the thickness direction of the substrate. In this case, the protrusions or projections define a surface structure or topography of the one side of the substrate, rendering this side uneven.

If the cushioning layer is attached to the back surface of the protective film, such protrusions can be embedded in the cushioning layer. Hence, any negative influence of the surface unevenness arising from the presence of the protrusions on subsequent substrate processing steps can be eliminated. In particular, the cushioning layer can significantly contribute to achieving a particularly uniform and homogeneous distribution of pressure during processing.

By embedding the protrusions in the cushioning layer, the protrusions, such as for example optical elements or other structures, are reliably protected from any damage during substrate processing.

The material of the cushioning layer is not particularly limited. In particular, the cushioning layer may be formed of any type of material which allows for protrusions protruding along the thickness direction of the substrate to be embedded therein. For example, the cushioning layer may be formed of a resin, an adhesive, a gel or the like.

The cushioning layer may be curable by an external stimulus, such as UV radiation, heat, an electric field and/or a chemical agent. In this case, the cushioning layer hardens at least to some degree upon application of the external stimulus thereto. For example, the cushioning layer may be formed of a curable resin, a curable adhesive, a curable gel or the like.

The cushioning layer may be configured so as to exhibit a degree of compressibility, elasticity and/or flexibility after curing thereof, i.e., to be compressible, elastic and/or flexible after curing. For example, the cushioning layer may be such that it is brought into a rubber-like state by curing. Alternatively, the cushioning layer may be configured so as to reach a rigid, hard state after curing.

Preferred examples of UV curable resins for use as the cushioning layer in the methods of the invention are ResiFlat by the DISCO Corporation and TEMPLOC by DENKA.

The method may further comprise applying the external stimulus to the cushioning layer so as to cure the cushioning layer, in particular, before processing the substrate. In this way, the protection of the substrate during processing and the processing accuracy can be further improved.

The cushioning layer may be heat resistant up to a temperature of 180° C. or more, preferably up to a temperature of 220° C. or more, more preferably up to a temperature of 250° C. or more, and even more preferably up to a temperature of 300° C. or more.

The cushioning layer may have a thickness in the range of 10 to 300 µm, preferably 20 to 250 µm and more preferably 50 to 200 µm.

The cushioning layer may be attached to the back surface of the protective film before applying the protective film to the one side of the substrate. In this case, the protective film and the cushioning layer may be laminated first, forming a protective sheeting comprising the cushioning layer and the protective film attached to the cushioning layer. The protective sheeting formed in this manner may be subsequently applied to the one side of the substrate, e.g., such that protrusions or projections protruding from the plane surface of the substrate are covered by the protective film and embedded in the protective film and the cushioning layer. The protective sheeting may be applied so that a back surface of the cushioning layer opposite to the front surface thereof is substantially parallel to the side of the substrate being opposite to the one side. The front surface of the protective film is applied to the one side of the substrate when the protective sheeting is applied to the one side of the substrate.

In this way, the substrate processing method can be carried out in a particularly simple and efficient manner. For example, the protective sheeting can be prepared in advance, stored for later use and used for substrate processing when required. The protective sheeting may thus be manufactured in large quantities, rendering the production thereof particularly efficient in terms of both time and cost.

The cushioning layer may be attached to the back surface of the protective film after applying the protective film to the one side of the substrate.

In this case, the protective film is applied to the one side of the substrate first, and the one side of the substrate, having the protective film applied thereto, is subsequently attached to the front surface of the cushioning layer, e.g., so that protrusions or projections protruding from the plane surface of the substrate are embedded in the protective film and the cushioning layer, and the back surface of the cushioning layer is substantially parallel to the side of the substrate being opposite to the one side. This approach allows for the protective film to be attached to the one side of the substrate with a particularly high degree of accuracy, in particular, in relation to protrusions or projections protruding from the plane surface of the substrate.

The cushioning layer may be attached to the back surface of the protective film before and/or during and/or after attaching the protective film to the one side of the substrate.

A base sheet may be attached to the back surface of the cushioning layer. A front surface of the base sheet may be attached to the back surface of the cushioning layer.

The material of the base sheet is not particularly limited. The base sheet may be made of a soft or pliable material, such as, for example, a polymer material, e.g., polyvinyl chloride (PVC), ethylene vinyl acetate (EVA) or a polyolefin.

Alternatively, the base sheet may be made of a rigid or hard material, such as polyethylene terephthalate (PET) and/or silicon and/or glass and/or stainless steel (SUS).

For example, if the base sheet is made of polyethylene terephthalate (PET) or glass and the cushioning layer is curable by an external stimulus, the cushioning layer may be cured with radiation that is transmittable through polyethylene terephthalate (PET) or glass, for instance UV radiation. If the base sheet is made of silicon or stainless steel (SUS), a cost-efficient base sheet is provided.

Also, the base sheet may be formed of a combination of the materials listed above.

The base sheet may be heat resistant up to a temperature of 180° C. or more, preferably up to a temperature of 220° C. or more, more preferably up to a temperature of 250° C. or more, and even more preferably up to a temperature of 300° C. or more.

The base sheet may have a thickness in the range of 30 to 1500 µm, preferably 40 to 1200 µm and more preferably 50 to 1000 µm.

The cushioning layer and the base sheet may be attached to the back surface of the protective film before or after applying the protective film to the one side of the substrate. In particular, the protective film, the cushioning layer and the base sheet may be laminated first, forming a protective sheeting comprising the base sheet, the cushioning layer and the protective film attached to the cushioning layer. The protective sheeting formed in this manner may be subsequently applied to the one side of the substrate.

The front surface of the base sheet may be in contact with the back surface of the cushioning layer, and a back surface of the base sheet opposite to the front surface thereof may be substantially parallel to the side of the substrate being opposite to the one side. Thus, when processing the side of the substrate being opposite to the one side, a suitable counter pressure can be applied to the back surface of the base sheet, e.g., by placing this back surface on a chuck table.

In this case, since the plane back surface of the base sheet is substantially parallel to the side of the substrate being opposite to the one side, pressure applied to the substrate during processing is more evenly and homogeneously distributed over the substrate, thus minimising any risk of breakage of the substrate. Further, the substantially parallel alignment of the flat, even back surface of the base sheet and the side of the substrate being opposite to the one side allows for substrate processing to be carried out with a high degree of precision.

The water-soluble material may consist of or comprise a water-soluble resin. In particular, the water-soluble material may consist of or comprise one or more of polyvinyl alcohol (PVA), polyethylene glycol (PEG) and polyvinylpyrrolidone (PVP).

By using a water-soluble material consisting of or comprising a water-soluble resin, in particular, one or more of PVA, PEG and PVP, the peeling force required for removing the protective film from the substrate can be controlled in an especially simple and reliable manner, e.g., by suitably choosing the material properties of the water-soluble material, such as, for example, the viscosity and/or the dilution thereof, in particular, the viscosity and/or the dilution of a liquid water-soluble material.

The material properties of the water-soluble material can be chosen such that an attachment force between the coating of the water-soluble material and the protective film is larger than an attachment force between the coating of the water-soluble material and the substrate. In this way, the possibility of residues of the water-soluble material remaining on the substrate after removal of the protective film from the substrate can be minimised.

The water-soluble material may be curable by an external stimulus, such as heat, UV radiation, an electric field and/or a chemical agent. By curing the water-soluble material, the properties of the material can be adjusted, e.g., by suitably choosing the curing conditions, for example, so as to lower the peeling force required for removing the protective film from the substrate. Moreover, the water-soluble material may be configured so that the water-soluble material hardens at least to some degree upon application of the external stimulus thereto.

The method may further comprise curing the water-soluble material after applying the coating of the water-soluble material to the protective film and/or to the substrate. The water-soluble material may be cured after processing the one side of the substrate and/or the side of the substrate being opposite to the one side.

The water-soluble material may be substantially free of silicone or free of silicone. In this way, a particularly high substrate surface quality can be achieved on the one side of the substrate after removing the protective film from the substrate. Using such a water-soluble material is particularly advantageous if the substrate is a semiconductor substrate, such as a semiconductor wafer.

The coating of the water-soluble material applied to the protective film and/or the coating of the water-soluble material applied to the substrate may have a thickness in the range of 0.5 to 5 µm, preferably 0.5 to 4 µm, more preferably 0.5 to 3 µm and even more preferably 0.5 to 2 µm. By choosing such a thickness of the coating, removal of the protective film from the substrate can be facilitated in a particularly efficient and reliable manner, while minimising the possibility of residues of the water-soluble material on the substrate.

The water-soluble material may be applied to the protective film and/or to the substrate in liquid form. In this way, it can be particularly reliably ensured that the desired portions of the protective film and/or the substrate to be coated are fully and homogeneously coated with the water-soluble material, also for the case of protrusions and/or recesses on the one side of the substrate. A particularly complete and homogeneous coating can be achieved by applying the water-soluble material to the protective film in liquid form. For example, the water-soluble material may be applied to the protective film and/or to the substrate by spray coating or spin coating. Moreover, the water-soluble material may be applied to the protective film and/or to the substrate by screen printing. After applying the water-soluble material to the protective film and/or to the substrate, the water-soluble material may be cured. In this way, the water-soluble material can be hardened, as has been detailed above. This approach allows for a particularly reliable placement or positioning of the water-soluble material on the protective film and/or on the substrate. Further, the thickness of the water-soluble material can be controlled in an especially accurate and reliable manner.

The water-soluble material may be applied to the protective film and/or to the substrate in solid form. In this way, the water-soluble material can be applied in a particularly simple manner. For example, the water-soluble material may be applied to the protective film and/or to the substrate in the form of a film or sheet, in particular, a thin film or sheet.

Processing the side of the substrate being opposite to the one side may comprise or consist of cutting the substrate along the thickness direction of the substrate. The substrate may be cut along its entire thickness, so as to fully divide the substrate, or along only part of its thickness. The substrate may be cut along one or more division lines, if present. The substrate may be divided into a plurality of separate elements. The separate elements may be, for example, chips or dies.

Cutting the substrate along the thickness direction of the substrate may consist of or comprise mechanically cutting the substrate and/or laser cutting the substrate and/or plasma cutting the substrate. For example, the substrate may be mechanically cut by blade dicing or sawing.

The substrate may be cut in a single mechanical cutting step, a single laser cutting step or a single plasma cutting step. Alternatively, the substrate may be cut by a sequence of mechanical cutting and/or laser cutting and/or plasma cutting steps.

Laser cutting may be performed, for example, by ablation laser cutting and/or by stealth laser cutting, i.e., by forming modified regions within the substrate by the application of a laser beam, as will be further detailed below, and/or by forming a plurality of hole regions in the substrate by the application of a laser beam. Each of these hole regions may be composed of a modified region and a space in the modified region open to a surface of the substrate.

In a stealth laser cutting process, a laser beam having a wavelength that allows transmission of the laser beam through the substrate is applied to the substrate. Thus, the substrate is made of a material which is transparent to the laser beam. The laser beam is applied to the substrate at least in a plurality of positions so as to form a plurality of modified regions in the substrate, e.g., inside or within the bulk of the substrate. In particular, the laser beam may be applied to the substrate at least in a plurality of positions along at least one division line so as to form a plurality of modified regions in the substrate along the at least one division line.

The laser beam may be a pulsed laser beam. The pulsed laser beam may have a pulse width, for example, in the range of 1 fs to 1000 ns.

The modified regions are regions of the substrate which have been modified by the application of the laser beam. The modified regions may be regions of the substrate in which the structure of the substrate material has been modified. The modified regions may be regions of the substrate in which the substrate has been damaged. The modified regions may comprise amorphous regions or regions in which cracks are formed or may be amorphous regions or regions in which cracks are formed.

By forming these modified regions, the strength of the substrate in the areas thereof where the modified regions are formed is reduced. Hence, the division of the substrate, e.g., along the at least one division line, where the plurality of modified regions has been formed is greatly facilitated.

The substrate may be fully divided in the stealth laser cutting process, e.g., if cracks in the substrate extend from the modified regions to the one side of the substrate and the side of the substrate being opposite to the one side. If the substrate is not fully divided in the stealth laser cutting process, the method may further comprise fully dividing the substrate, e.g., by applying an external force thereto.

Processing the side of the substrate being opposite to the one side may comprise or consist of thinning the substrate so as to reduce the thickness of the substrate. Thinning the substrate may consist of or comprise grinding the substrate from the side of the substrate being opposite to the one side and/or polishing the substrate from the side of the substrate being opposite to the one side and/or etching the substrate from the side of the substrate being opposite to the one side.

Processing the one side of the substrate may comprise or consist of processing the one side of the substrate through the protective film, e.g., by employing a stealth laser cutting process. In such a process, the laser beam is applied to the substrate through the protective film. In this case, the wavelength of the laser beam is chosen so that the laser beam is transmitted through the protective film, i.e., so that the protective film is transparent for the laser beam.

The substrate may be fully divided in the stealth laser cutting process, e.g., if cracks in the substrate extend from the modified regions to the one side of the substrate and the side of the substrate being opposite to the one side. If the substrate is not fully divided in the stealth laser cutting process, the method may further comprise fully dividing the substrate, e.g., by applying an external force thereto.

The method may further comprise removing the protective film from the substrate after processing the one side of the substrate and/or the side of the substrate being opposite to the one side. By providing the coating of the water-soluble material between protective film and substrate at least in the central area or portion, the removal of the protective film from the substrate is significantly facilitated, as has been detailed above. In particular, the water-soluble material can lower the peeling force required for peeling off the protective film. Hence, the risk of any damage to the substrate in the process of removing the protective film therefrom is reduced even further. Moreover, due to this presence of the water-soluble material, the risk of any residues of the protective film material remaining on the substrate after removal of the protective film is minimised.

The method may further comprise removing the protective film and the cushioning layer from the substrate. The protective film and the cushioning layer may be removed from the substrate after processing the one side of the substrate and/or the side of the substrate being opposite to the one side.

The cushioning layer and the protective film may be removed individually, i.e., one after the other. For example, the cushioning layer may be removed first, followed by the removal of the protective film. Alternatively, the cushioning layer and the protective film may be removed together.

The method may further comprise removing the protective film, the cushioning layer and the base sheet from the substrate. The protective film, the cushioning layer and the base sheet may be removed from the substrate after processing the one side of the substrate and/or the side of the substrate being opposite to the one side.

The base sheet, the cushioning layer and the protective film may be removed individually, i.e., one after the other. For example, the base sheet may be removed first, followed by the removal of the cushioning layer and the subsequent removal of the protective film. Also, the base sheet may be removed together with the cushioning layer first, followed by the removal of the protective film. Alternatively, the base sheet, the cushioning layer and the protective film may be removed together.

The method may further comprise, after removing the protective film from the substrate, cleaning the one side of the substrate, in particular, cleaning the one side of the substrate with water. If residues of the water-soluble material remain on the substrate after protective film removal, such residues can be removed in a simple, reliable and efficient manner by cleaning the one side of the substrate, in particular, by cleaning the one side of the substrate with water, due to the water-soluble nature of the material. Hence, a substrate surface which is free of any residues or other types of contaminants can be achieved on the one side of the substrate. For example, the one side of the substrate may be cleaned with deionised water.

BRIEF DESCRIPTION OF THE DRAWINGS

Hereinafter, non-limiting examples of the invention are explained with reference to the drawings, in which.

DETAILED DESCRIPTION OF PREFERRED EMBODIMENTS

Preferred embodiments of the present invention will now be described with reference to the accompanying drawings. The preferred embodiments relate to methods of processing a substrate.

Figure 1:
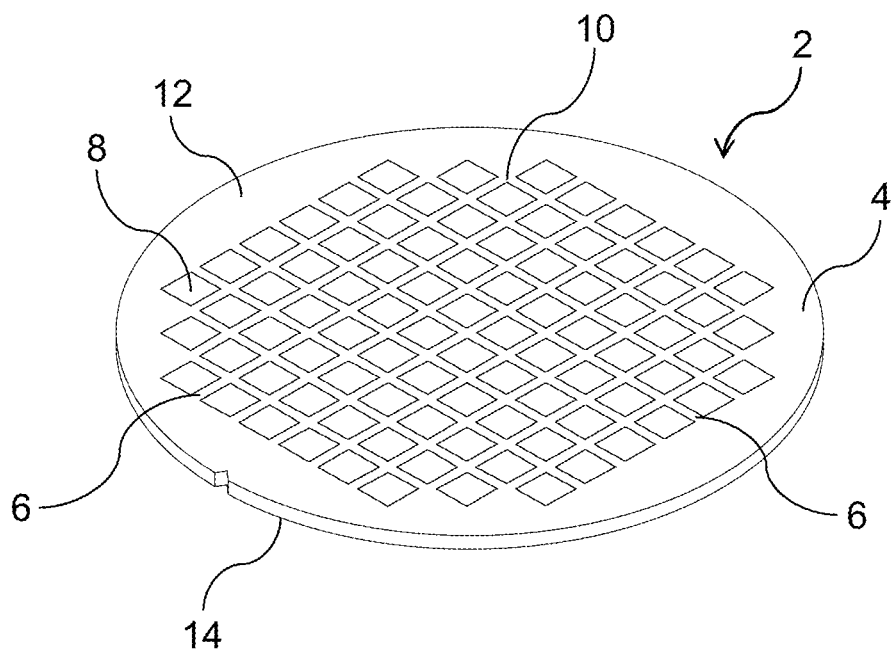
FIG. 1 is a perspective view showing a wafer as a substrate to be processed by methods of the present invention.

In the first to third embodiments, the processing methods of the invention are performed on a wafer 2 as the substrate (see FIG. 1). The wafer 2 can be, for example, a MEMS wafer having MEMS devices formed on the surface of one side 4, i.e., a front side, thereof. However, the wafer 2 is not limited to a MEMS wafer, but may also be a CMOS wafer having CMOS devices, preferably as solid-state imaging devices, formed on the front side 4 thereof or a wafer with other types of devices on the front side 4.

The wafer 2 may be made of a semiconductor, e.g., silicon (Si). Such a silicon wafer 2 can include devices, such as ICs (integrated circuits) and LSIs (large scale integrations), on a silicon substrate. Alternatively, the wafer 2 may be an optical device wafer configured by forming optical devices, such as LEDs (light emitting diodes), on an inorganic material substrate of, for example, ceramic, glass or sapphire. The wafer 2 is not limited to this and can be formed in any other way. Furthermore, also a combination of the above described exemplary wafer designs is possible.

The wafer 2 can have a thickness in the μm range, preferably in the range of 30 to 1000 μm.

The wafer 2 preferably exhibits a circular shape. However, the shape of the wafer 2 is not particularly limited. In other embodiments, the wafer 2 may have, for example, an oval shape, an elliptical shape or a polygonal shape, such as a rectangular shape or a square shape.

The wafer 2 is provided with a plurality of crossing division lines 6 (see FIG. 1), also termed streets, formed on the front side 4 thereof, thereby partitioning the wafer 2 into a plurality of rectangular regions where devices 8, such as those described previously, are respectively formed. These devices 8 are formed in a device area 10 of the wafer 2. In the case of a circular wafer 2, this device area 10 is preferably substantially circular and arranged concentrically with the outer circumference of the wafer 2.

Figure 2:
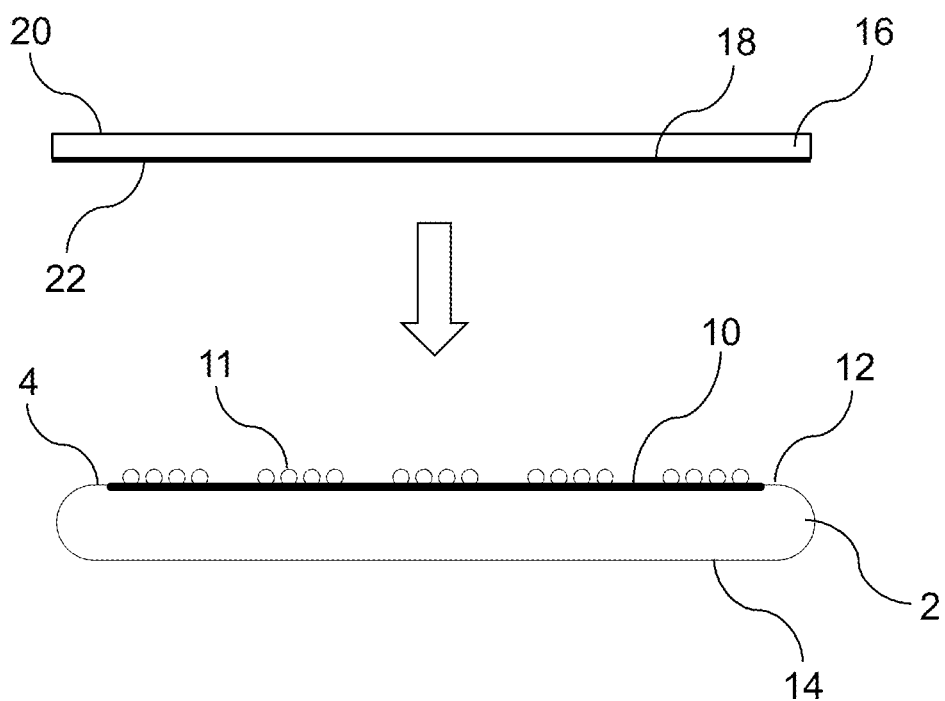
FIG. 2 is a cross-sectional view illustrating a step of applying a protective film to one side of the wafer in a method according to a first embodiment of the present invention.

The device area 10 of the wafer 2 is formed with a plurality of protrusions 11 protruding from a plane surface of the wafer 2 (see FIG. 2). The protrusions 11 may be, for example, bumps for establishing an electrical contact with the devices 8 of the device area 10. The height of the protrusions 11 in the thickness direction of the wafer 2 may be in the range of 20 to 500 μm.

The device area 10 is surrounded by an annular peripheral marginal area 12, as is schematically shown in FIG. 1. In this peripheral marginal area 12, no devices are formed. The peripheral marginal area 12 is preferably arranged concentrically to the device area 10 and/or the outer circumference of the wafer 2. The radial extension of the peripheral marginal area 12 can be in the mm range and preferably ranges from 1 to 3 mm.

The wafer 2 further has a side 14, i.e., a back side, opposite to the front side 4 (see FIG. 1).

In the following, a first embodiment of the present invention will be described with reference to FIGS. 1 to 5.

A protective film 16 having a front surface 18 and a back surface 20 opposite to the front surface 18 is provided (see FIG. 2).

The protective film 16 may be made of a plastic material, such as a polymer. For example, the protective film 16 may be made of a polyolefin, such as polyethylene (PE), polypropylene (PP) or polybutylene (PB). The protective film 16 may have a thickness in the range of 5 to 500 μm, preferably 5 to 200 μm, more preferably 8 to 100 μm, even more preferably 10 to 80 μm and yet even more preferably 12 to 50 μm. In the present embodiment, the protective film 16 has a substantially circular shape in a top view thereon and an outer diameter which is substantially the same as the outer diameter of the wafer 2. In other embodiments, the outer diameter of the protective film 16 may be smaller, e.g., slightly smaller, or larger, e.g., slightly larger, than the outer diameter of the wafer 2. For example, the outer diameter of the protective film 16 may be smaller than the outer diameter of the wafer 2 but substantially the same as or larger than the outer diameter of the device area 10 of the wafer 2.

A coating of a water-soluble material 22 is applied to the entire front surface 18 of the protective film 16 (see FIG. 2). The water-soluble material 22 may consist of or comprise a water-soluble resin, such as PVA, PEG and/or PVP. The coating of the water-soluble material 22 may have a thickness in the range of 0.5 to 5 μm, preferably 0.5 to 4 μm, more preferably 0.5 to 3 μm and even more preferably 0.5 to 2 μm. In the present embodiment, the water-soluble material 22 is applied to the protective film 16 in liquid form, for example, by spray coating or spin coating or screen printing.

For example, the coating of the water-soluble material 22 may be applied to the front surface 18 of the protective film 16 shortly, e.g., immediately, before applying the protective film 16 to the front side 4 of the wafer 2 or in advance, e.g., during or shortly after manufacture of the protective film 16.

After applying the coating of the water-soluble material 22 to the protective film 16, the protective film 16 is applied to the front side 4 of the wafer 2, as is indicated by an arrow in FIG. 2. The front surface 18 of the protective film 16 faces the front side 4 of the wafer 2 and the protective film 16 is applied to the wafer 2 so that no adhesive is present between the entire front surface 18 of the protective film 16 and the entire front side 4 of the wafer 2. The entire front surface 18 of the protective film 16 is free of adhesive. Hence, in the entire region in which the protective film 16 and the wafer 2 are in contact with each other, only the water-soluble material 22 is present between protective film 16 and wafer 2. The protective film 16 is applied to the front side 4 of the wafer 2 so as to cover the devices 8 formed in the device area 10 and thus protect the devices 8, e.g., from contamination and damage.

Figure 3:
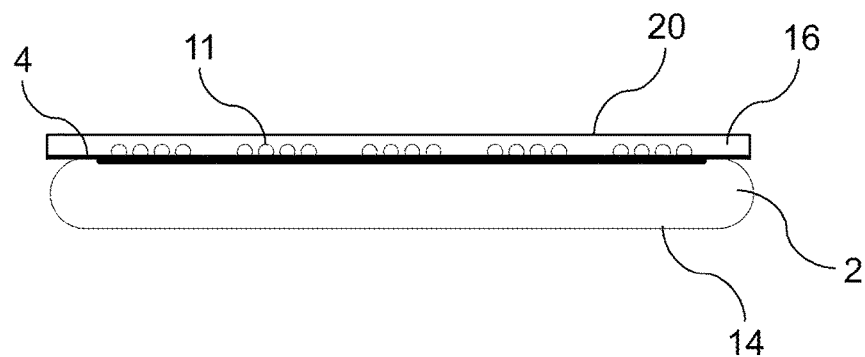
FIG. 3 is a cross-sectional view showing the outcome of a step of attaching the protective film to the one side of the wafer in the method according to the first embodiment.

After applying the protective film 16 to the front side 4 of the wafer 2, an external stimulus is applied to the protective film 16, so that the protective film 16 is attached to the front side 4 of the wafer 2. The outcome of this attachment step is shown in FIG. 3.

Applying the external stimulus to the protective film 16 may consist of or comprise heating the protective film 16 and/or cooling the protective film 16 and/or applying pressure to the protective film 16 and/or applying a vacuum to the protective film 16 and/or irradiating the protective film 16 with radiation, such as light or UV radiation, e.g., by using a laser beam, as has been detailed above. In particular, in the present embodiment, applying the external stimulus to the protective film 16 may consist of or comprise heating the protective film 16. An attachment force between protective film 16 and wafer 2 may be generated through the heating process. The protective film 16 may be pliable, elastic, flexible, stretchable, soft and/or compressible when in its heated state. In this way, it can be particularly reliably ensured that the protective film 16 conforms to the wafer surface on the front side 4 of the wafer 2, e.g., absorbing the wafer topography and following the contours of the protrusions 11 (see FIG. 3). The protrusions 11 may be at least partly embedded in the protective film 16.

After attaching the protective film 16 to the front side 4 of the wafer 2, the front side 4 of the wafer 2 and/or the back side 14 of the wafer 2 is processed in a state in which the protective film 16 is attached to the wafer 2. Hence, during processing of the wafer 2, the wafer 2, in particular, the devices 8 formed in the device area 10, is reliably protected, e.g., from contamination and damage.

Processing the back side 14 of the wafer 2 may comprise or consist of cutting the wafer 2 from the back side 14, e.g., along the division lines 6 (see FIG. 1). For example, the wafer 2 may be cut along its entire thickness, so as to fully divide the wafer 2, or along only part of its thickness. The wafer 2 may be fully divided along the division lines 6 by cutting so as to obtain a plurality of separate elements, such as chips or dies. Each of the chips or dies thus obtained may comprise one or more of the devices 8.

Cutting the wafer 2 from the back side 14 may consist of or comprise mechanically cutting the wafer 2 and/or laser cutting the wafer 2 and/or plasma cutting the wafer 2, as has been detailed above.

Processing the back side 14 of the wafer 2 may comprise or consist of thinning the wafer 2 so as to reduce the thickness of the wafer 2. Thinning the wafer 2 may consist of or comprise grinding the wafer 2 from the back side 14 and/or polishing the wafer 2 from the back side 14 and/or etching the wafer 2 from the back side 14, as has been detailed above.

Processing the front side 4 of the wafer 2 may comprise or consist of processing the front side 4 through the protective film 16, e.g., by employing a stealth laser cutting process. In such a process, the laser beam is applied to the wafer 2 through the protective film 16, as has been detailed above.

After processing the front side 4 of the wafer 2 and/or the back side 14 of the wafer 2, the protective film 16 is removed from the wafer 2. Since, in the entire region in which the protective film 16 and the wafer 2 are in contact with each other, the water-soluble material 22 is present between protective film 16 and wafer 2, the removal of the protective film 16 from the wafer 2 is significantly facilitated. In particular, the water-soluble material 22 lowers the peeling force required for peeling off the protective film 16 from the wafer 2. Hence, the risk of any damage to the wafer 2 in the process of removing the protective film 16 therefrom is reduced even further. Moreover, due to this presence of the water-soluble material 22, the risk of any residues of the protective film material remaining on the wafer 2 after removal of the protective film 16 is minimised.

After removing the protective film 16 from the wafer 2, the front side 4 of the wafer 2 may be cleaned with water, e.g., deionised water. If residues of the water-soluble material 22 remain on the wafer 2 after protective film removal, e.g., due to the presence of the protrusions 11 on the wafer 2, such residues can be removed in a simple, reliable and efficient manner by cleaning the front side 4 with water, due to the water-soluble nature of the water-soluble material 22. Hence, a wafer surface which is free of any residues or other types of contaminants can be achieved on the front side 4 of the wafer 2.

Figure 4:
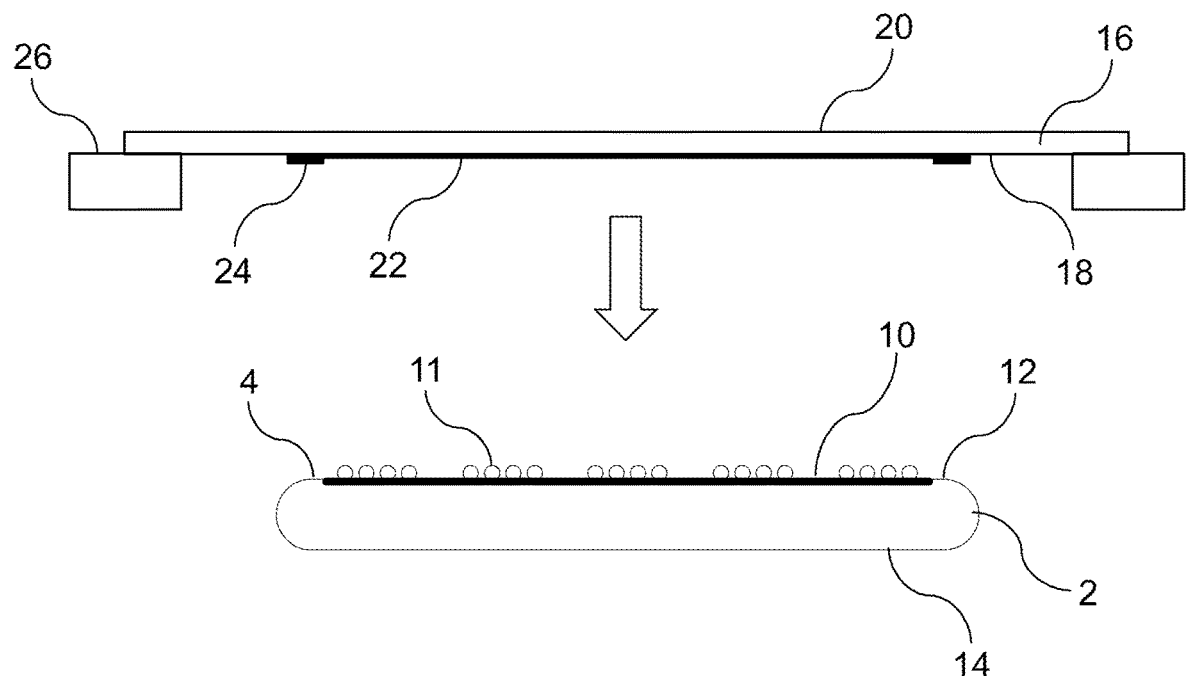
FIG. 4 is a cross-sectional view illustrating a step of applying a protective film to the one side of the wafer in a method according to a modification of the first embodiment.

FIG. 4 illustrates a step of applying the protective film 16 to the front side 4 of the wafer 2 in a method according to a modification of the first embodiment. The method of this modification differs from the method of the first embodiment in that the outer diameter of the protective film 16 is larger than the outer diameter of the wafer 2, the coating of the water-soluble material 22 is applied only to a central area of the front surface 18 of the protective film 16 and the protective film 16 is provided with an adhesive layer 24 which is present only in a peripheral area of the front surface 18 of the protective film 16 (see FIG. 4).

As is further shown in FIG. 4, an outer peripheral portion of the protective film 16 is attached to an annular frame 26. In particular, the outer peripheral portion of the protective film 16 is attached to the annular frame 26 so that the protective film 16 closes a central opening of the annular frame 26, i.e., the area inside the inner diameter of the annular frame 26. In the present embodiment, the step of attaching the outer peripheral portion of the protective film 16 to the annular frame 26 is performed before applying the protective film 16 to the wafer 2. In this way, the handling of the protective film 16, in particular, when applying and attaching the protective film 16 to the wafer 2, is facilitated. Further, after attaching the protective film 16 to the wafer 2, the wafer 2 can be held by the annular frame 26 through the protective film 16. Thus, a wafer unit, comprising the wafer 2, the protective film 16 and the annular frame 26, is formed, facilitating processing, handling and/or transport of the wafer 2.

The protective film 16 may be attached to the annular frame 26 by an adhesive, e.g., by a portion of the adhesive layer 24, as will be detailed below. Moreover, the protective film 16 may be attached to the annular frame 26 by applying an external stimulus to the protective film 16. In this case, no adhesive may be present between the protective film 16 and the annular frame 26. Applying the external stimulus to the protective film 16 may consist of or comprise heating the protective film 16 and/or cooling the protective film 16 and/or applying pressure to the protective film 16 and/or applying a vacuum to the protective film 16 and/or irradiating the protective film 16 with radiation, such as light or UV radiation, e.g., by using a laser beam, as has been detailed above. In particular, applying the external stimulus to the protective film 16 may consist of or comprise heating the protective film 16. An attachment force between protective film 16 and annular frame 26 may be generated through the heating process.

The central area of the front surface 18 of the protective film 16 to which the water-soluble material 22 is applied corresponds to and is substantially congruent with the device area 10 of the wafer 2. The peripheral area of the front surface 18 of the protective film 16 which is provided with the adhesive layer 24 surrounds the central area of the front surface 18 of the protective film 16. The peripheral area of the front surface 18 of the protective film 16 which is provided with the adhesive layer 24 corresponds to and is substantially congruent with the peripheral marginal area 12 of the wafer 2. The adhesive layer 24 has a substantially annular shape. The protective film 16 is applied to the front side 4 of the wafer 2 (as indicated by an arrow in FIG. 4) so that the adhesive layer 24 comes into contact only with the peripheral marginal area 12 of the wafer 2. Between the central area of the front surface 18 of the protective film 16 and the device area 10 of the wafer 2, only the water-soluble material 22 is present.

The embodiment illustrated in FIG. 4 can be further modified in various ways. In particular, the adhesive layer 24 may be provided in the entire region of the front surface 18 of the protective film 16 which lies outside, i.e., radially outside, the central area of the front surface 18 of the protective film 16. In this case, the adhesive layer 24 extends from an outer circumferential edge of the central area of the front surface 18 of the protective film 16 to an outer circumferential edge of the protective film 16. Alternatively, for instance, the adhesive layer 24 may be provided only in those regions of the front surface 18 of the protective film 16 which come into contact with the peripheral marginal area 12 of the wafer 2 (see FIGS. 4 and 5) and with the annular frame 26.

In the embodiment illustrated in FIG. 4, the water-soluble material 22 is applied only to the central area of the front surface 18 of the protective film 16. The water-soluble material 22 thus extends, i.e., radially extends, up to an inner circumferential edge of the adhesive layer 24. No water-soluble material 22 is present outside, i.e., radially outside, the inner circumferential edge of the adhesive layer 24. This arrangement can be particularly reliably achieved, for example, by covering the region of the front surface 18 of the protective film 16 outside the inner circumferential edge of the adhesive layer 24, i.e., the region outside the central area of the front surface 18 of the protective film 16, e.g., by using a mask, when applying the water-soluble material 22 to the front surface 18 of the protective film 16. The water-soluble material 22 may be applied to the front surface 18 of the protective film 16, for instance, by screen printing or spray coating.

Alternatively, for example, the coating of the water-soluble material 22 may be applied to the entire front surface 18 of the protective film 16. The coating of the water-soluble material 22 may be applied to the entire portion of the front surface 18 of the protective film 16 which comes into contact with the front side 4 of the wafer 2. In those regions of the front surface 18 of the protective film 16 in which the adhesive layer 24 is present, the water-soluble material 22 may be provided on top of the adhesive layer 24, i.e., on the side of the adhesive layer 24 which is opposite to the side of the adhesive layer 24 in contact with the protective film 16.

Figure 5:
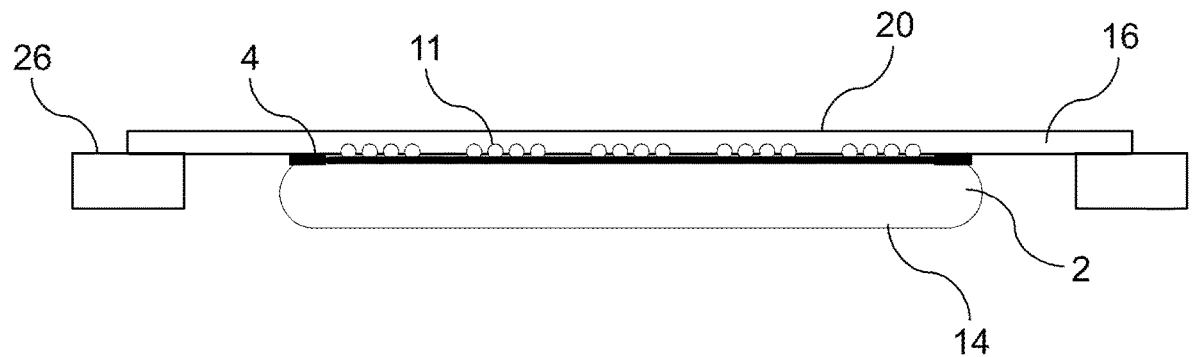
FIG. 5 is a cross-sectional view showing the outcome of a step of attaching the protective film to the one side of the wafer in the method according to the modification of the first embodiment.

After applying the protective film 16 to the front side 4 of the wafer 2, an external stimulus is applied to the protective film 16, so that the protective film 16 is attached to the front side 4 of the wafer 2. The outcome of this attachment step is shown in FIG. 5.

The external stimulus is applied to the protective film 16 in the same manner as detailed above for the method according to the first embodiment, thus attaching the central area of the front surface 18 of the protective film 16 to the device area 10 of the wafer 2. Further, the peripheral area of the front surface 18 of the protective film 16 is attached to the peripheral marginal area 12 of the wafer 2 by means of the adhesive layer 24. By providing the adhesive layer 24, the attachment of the protective film 16 to the wafer 2 can be further improved. Since the adhesive layer 24 is present only in the peripheral area of the front surface 18 of the protective film 16, the area in which protective film 16 and wafer 2 are attached to each other by the adhesive layer 24 is significantly reduced as compared to a case where an adhesive layer is provided on the entire front surface 18 of the protective film 16. Thus, the protective film 16 can be detached from the wafer 2 more easily and the risk of damage to the wafer 2 is considerably reduced. Moreover, since the adhesive layer 24 comes into contact only with the peripheral marginal area 12 of the wafer 2 in which no devices are formed, a possible contamination of the devices 8 in the device area 10 by adhesive residues is reliably prevented.

The adhesive of the adhesive layer 24 may be curable by an external stimulus, such as heat, UV radiation, an electric field and/or a chemical agent. In this way, the protective film 16 can be particularly easily removed from the wafer 2 after processing. The external stimulus may be applied to the adhesive so as to lower the adhesive force thereof, thus allowing for an especially easy removal of the protective film 16.

After attaching the protective film 16 to the front side 4 of the wafer 2, the steps of processing the front side 4 of the wafer 2 and/or the back side 14 of the wafer 2, removing the protective film 16 from the wafer 2 and cleaning the front side 4 of the wafer 2 with water, e.g., deionised water, may be performed in the same manner as detailed above for the method according to the first embodiment.

Since, between the central area of the front surface 18 of the protective film 16 and the device area 10 of the wafer 2, the water-soluble material 22 is present, the removal of the protective film 16 from the wafer 2 is significantly facilitated. In particular, the water-soluble material 22 lowers the peeling force required for peeling off the protective film 16 from the wafer 2. Hence, the risk of any damage to the wafer 2 in the process of removing the protective film 16 therefrom, in particular, in the device area 10, is reduced even further. Moreover, due to this presence of the water-soluble material 22, the risk of any residues of the protective film material remaining on the wafer 2, in particular, in the device area 10, after removal of the protective film 16 is minimised. The process of removing the protective film 16 from the wafer 2 may be further facilitated by curing the adhesive of the adhesive layer 24 by the application of an external stimulus thereto, as has been detailed above.

In the following, a second embodiment of the present invention will be described with reference to FIGS. 6 to 8.

The method according to the second embodiment differs from the method according to the first embodiment in that a coating of the water-soluble material 22 is applied to the front side 4 of the wafer 2 rather than to the front surface 18 of the protective film 16 and in that the outer diameter of the protective film 16 is larger than the outer diameter of the wafer 2. Further, the method of the second embodiment comprises the optional step of attaching the wafer 2 to a mount tape 28 (see FIG. 6). The remaining steps of the method of the first embodiment are performed in the same manner in the method of the second embodiment. Hence, a repeated detailed description thereof is omitted.

In particular, optionally, in the method of the second embodiment, the back side 14 of the wafer 2 is attached to the mount tape 28, for example, by means of an adhesive. The adhesive may be present on the entire surface of the mount tape 28 which comes into contact with the back side 14 of the wafer 2 or only in a peripheral area of this surface. Alternatively, no adhesive may be present between the mount tape 28 and the back side 14 of the wafer 2. In this case, the mount tape 28 may be attached to the back side 14 of the wafer 2 by applying an external stimulus to the mount tape 28, such as the external stimulus detailed above.

Figure 6:
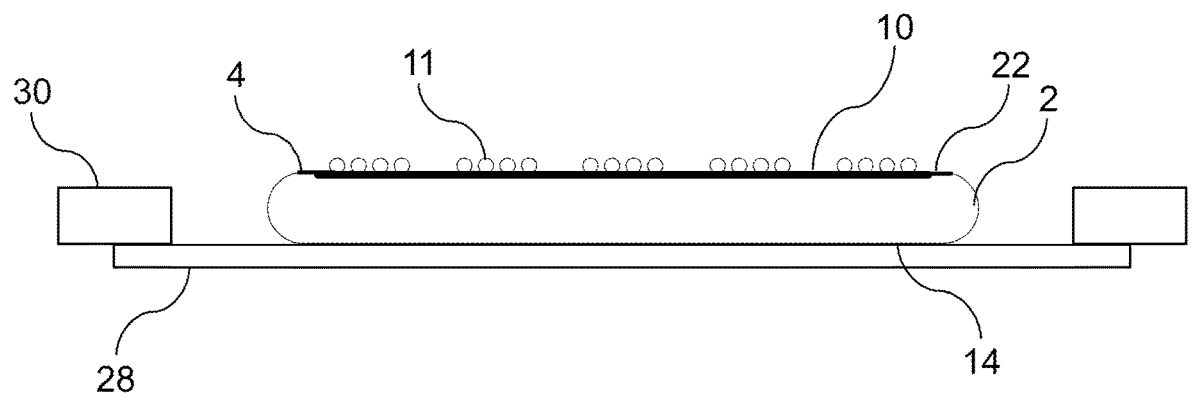
FIG. 6 is a cross-sectional view showing the outcome of a step of applying a coating of a water-soluble material to the wafer in a method according to a second embodiment of the present invention.

As is further shown in FIG. 6, an outer peripheral portion of the mount tape 28 is attached to an annular frame 30. In particular, the outer peripheral portion of the mount tape 28 is attached to the annular frame 30 so that the mount tape 28 closes a central opening of the annular frame 30, i.e., the area inside the inner diameter of the annular frame 30. In the present embodiment, the step of attaching the outer peripheral portion of the mount tape 28 to the annular frame 30 is performed before applying the coating of the water-soluble material 22 to the front side 4 of the wafer 2. In this way, the handling of the wafer 2, in particular, when applying the coating of the water-soluble material 22 thereto, is facilitated.

After attaching the mount tape 28 to the back side 14 of the wafer 2, the coating of the water-soluble material 22 is applied to the entire front side 4 of the wafer 2. The outcome of this application step is shown in FIG. 6. The coating of the water-soluble material 22 covers the entire front side 4 of the wafer 2 including the surfaces of the protrusions 11. The coating of the water-soluble material 22 applied to the front side 4 of the wafer 2 may have a thickness in the range of 0.5 to 5 µm, preferably 0.5 to 4 µm, more preferably 0.5 to 3 µm and even more preferably 0.5 to 2 µm.

The water-soluble material 22 applied to the front side 4 of the wafer 2 is the same water-soluble material as described above for the method of the first embodiment. In particular, the water-soluble material 22 may consist of or comprise a water-soluble resin, such as PVA, PEG and/or PVP.

In the present embodiment, the water-soluble material 22 is applied to the front side 4 of the wafer 2 in liquid form, for example, by spray coating or spin coating or screen printing. In this application process, a support or carrier, such as a chuck table, on which the wafer 2 may be held is protected from contamination by the liquid water-soluble material 22 due to the presence of the mount tape 28.

Figure 7:
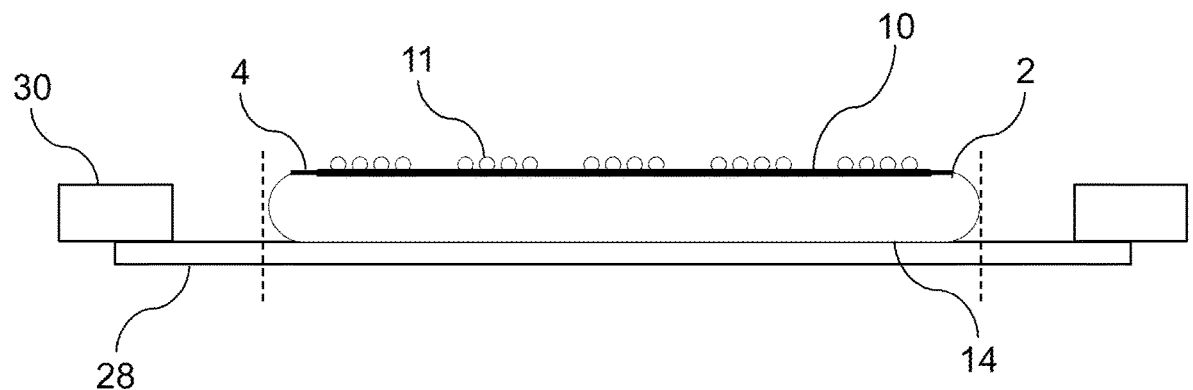
FIG. 7 is a cross-sectional view illustrating a step of cutting a mount tape attached to the wafer in the method according to the second embodiment.
Figure 8:
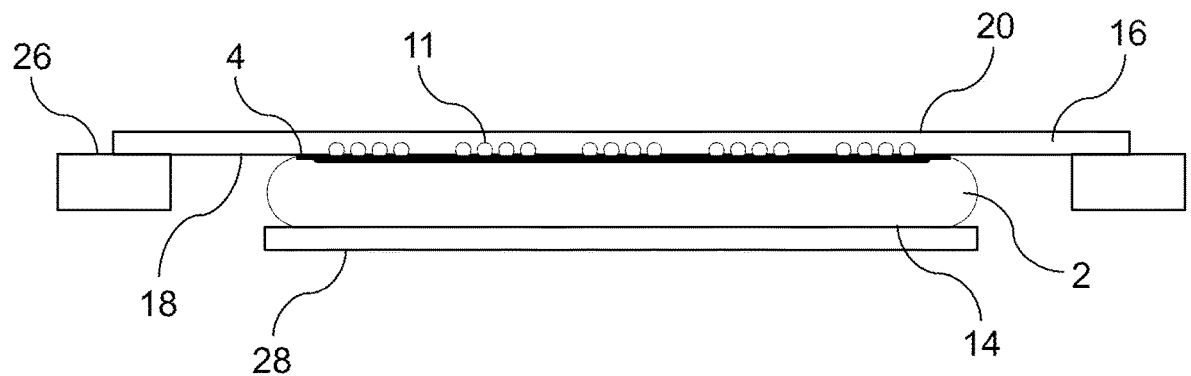
FIG. 8 is a cross-sectional view showing the outcome of a step of attaching a protective film to the one side of the wafer in the method according to the second embodiment.

After applying the coating of the water-soluble material 22 to the front side 4 of the wafer 2, an optional step of cutting the mount tape 28 along the outer circumference of the wafer 2, e.g., by using a cutting blade, is performed, as is indicated by dashed lines in FIG. 7. The mount tape 28 is cut so that it has an outer diameter which is substantially the same as the outer diameter of the wafer 2 (see FIGS. 7 and 8). This cutting step facilitates the subsequent application of the protective film 16 to the wafer 2, in particular, since the protective film 16 is also held by an annular frame, i.e., the annular frame 26 (see FIG. 8).

As an alternative optional step, rather than cutting the mount tape 28, the mount tape 28 may be removed from the wafer 2 after applying the coating of the water-soluble material 22 to the front side 4 of the wafer 2 and before applying the protective film 16 to the wafer 2.

After the optional step of cutting the mount tape 28 or removing the mount tape 28 from the wafer 2, the protective film 16 is applied and attached to the front side 4 of the wafer 2. The outcome of these steps is shown in FIG. 8.

The steps of applying and attaching the protective film 16 to the wafer 2 are performed in the same manner as detailed above for the method of the first embodiment. The outer peripheral portion of the protective film 16 is attached to the annular frame 26 in the same manner as in the method according to the modification of the first embodiment.

In particular, when applying the protective film 16 to the wafer 2, the front surface 18 of the protective film 16 faces the front side 4 of the wafer 2 and the protective film 16 is applied to the wafer 2 so that no adhesive is present between the entire front surface 18 of the protective film 16 and the entire front side 4 of the wafer 2. The entire front surface 18 of the protective film 16 is free of adhesive. Hence, in the entire region in which the protective film 16 and the wafer 2 are in contact with each other, only the water-soluble material 22 is present between protective film 16 and wafer 2. The protective film 16 is applied to the front side 4 of the wafer 2 so as to cover the devices 8 formed in the device area 10 and thus protect the devices 8, e.g., from contamination and damage.

After applying the protective film 16 to the front side 4 of the wafer 2, an external stimulus is applied to the protective film 16, so that the protective film 16 is attached to the front side 4 of the wafer 2. The external stimulus is applied to the protective film 16 in the same manner as detailed above for the method according to the first embodiment.

After attaching the protective film 16 to the front side 4 of the wafer 2, the steps of processing the front side 4 of the wafer 2 and/or the back side 14 of the wafer 2, removing the protective film 16 from the wafer 2 and cleaning the front side 4 of the wafer 2 with water, e.g., deionised water, may be performed in the same manner as detailed above for the method according to the first embodiment.

In a method according to a modification of the second embodiment, a protective film 16 with an outer diameter which is substantially the same as the outer diameter of the wafer 2 may be used (see FIGS. 2 and 3). This modified method substantially differs from the method according to the first embodiment only in that the coating of the water-soluble material 22 is applied to the front side 4 of the wafer 2 rather than to the front surface 18 of the protective film 16.

In other embodiments, a coating of the water-soluble material 22 may be applied to the front side 4 of the wafer 2 and a coating of the water-soluble material 22 may be applied to the front surface 18 of the protective film 16.

Further, the protective film 16 may be provided with an adhesive layer 24 which is present only in a peripheral area of the front surface 18 of the protective film 16 in the same manner as detailed above for the method according to the modification of the first embodiment (see FIG. 4).

Moreover, the arrangement of the adhesive layer 24 and/or the arrangement of the water-soluble material 22 can be modified, e.g., in the ways detailed above in relation to the modification of the first embodiment.

In the following, a third embodiment of the present invention will be described with reference to FIGS. 9 and 10.

Figure 9:
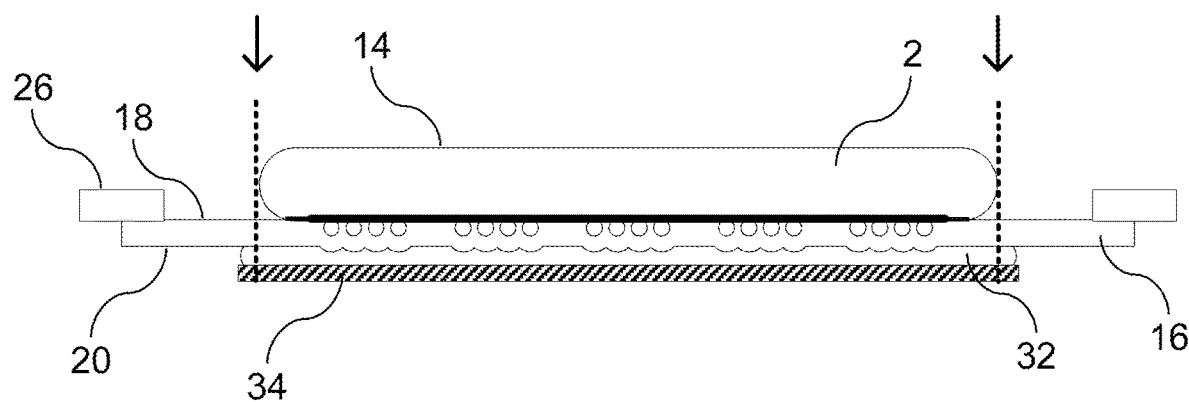
FIG. 9 is a cross-sectional view illustrating a step of cutting a protective film, a cushioning layer and a base sheet attached to the wafer in a method according to a third embodiment of the present invention.
Figure 10:
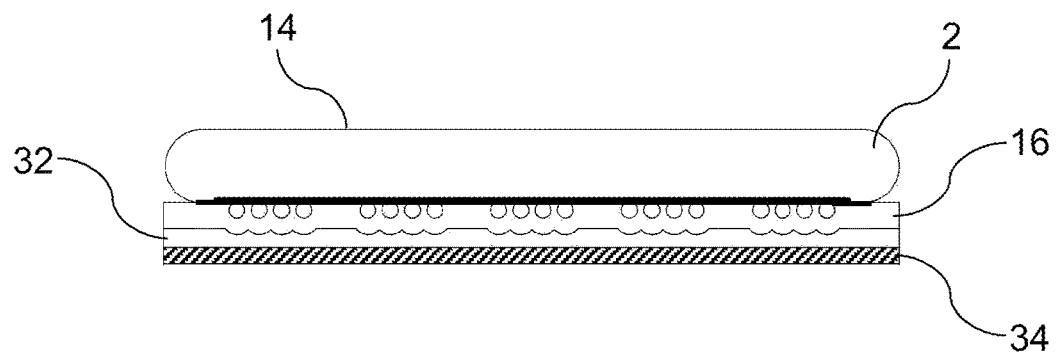
FIG. 10 is a cross-sectional view showing the outcome of the step illustrated in FIG. 9.

The method according to the third embodiment differs from the method according to the second embodiment in that a cushioning layer 32 and a base sheet 34 are attached to the back surface 20 of the protective film 16 (see FIGS. 9 and 10). Further, an optional step of cutting the protective film 16, the cushioning layer 32 and the base sheet 34 attached to the wafer 2 is performed. The remaining steps of the method of the second embodiment are performed in the same manner in the method of the third embodiment. Hence, a repeated detailed description thereof is omitted.

In particular, in the method of the third embodiment, the cushioning layer 32 and the base sheet 34 may be attached to the back surface 20 of the protective film 16 before applying and attaching the protective film 16 to the front side 4 of the wafer 2. A front surface of the cushioning layer 32 is attached to the back surface 20 of the protective film 16 and a front surface of the base sheet 34 is attached to a back surface of the cushioning layer 32. The back surface of the cushioning layer 32 is opposite to the front surface of the cushioning layer 32. The cushioning layer 32 and the base sheet 34 may have the features, properties and characteristics detailed above.

The protective film 16, having the cushioning layer 32 and the base sheet 34 attached thereto, is applied and attached to the front side 4 of the wafer 2 in the same manner as detailed above for the method according to the second embodiment.

When applying and attaching the protective film 16, having the cushioning layer 32 and the base sheet 34 attached thereto, to the front side 4 of the wafer 2, the protrusions 11 are embedded in the protective film 16 and the cushioning layer 32 and, thus, particularly reliably protected from any damage during wafer processing, as has been detailed above.

After attaching the protective film 16 with the cushioning layer 32 and the base sheet 34 attached thereto to the front side 4 of the wafer 2, an optional step of cutting the protective film 16, the cushioning layer 32 and the base sheet 34 along the outer circumference of the wafer 2, e.g., by using a cutting blade, is performed, as is indicated by arrows and dashed lines in FIG. 9. The outcome of this cutting step is shown in FIG. 10. The protective film 16, the cushioning layer 32 and the base sheet 34 are cut so that each of them has an outer diameter which is substantially the same as the outer diameter of the wafer 2 (see FIGS. 9 and 10). This cutting step can facilitate the subsequent handling of the wafer 2, in particular, when processing the front side 4 of the wafer 2 and/or the back side 14 of the wafer 2.

After the optional step of cutting the protective film 16, the cushioning layer 32 and the base sheet 34, the steps of processing the front side 4 of the wafer 2 and/or the back side 14 of the wafer 2, removing the protective film 16 from the wafer 2 and cleaning the front side 4 of the wafer 2 with water, e.g., deionised water, may be performed in the same manner as detailed above for the methods according to the first and second embodiments.

The base sheet 34, the cushioning layer 32 and the protective film 16 may be removed from the wafer 2 individually, i.e., one after the other. For example, the base sheet 34 may be removed first, followed by the removal of the cushioning layer 32 and the subsequent removal of the protective film 16. Also, the base sheet 34 may be removed together with the cushioning layer 32 first, followed by the removal of the protective film 16. Alternatively, the base sheet 34, the cushioning layer 32 and the protective film 16 may be removed together.

The method according to the third embodiment may be modified by applying the coating of the water-soluble material 22 to the front surface 18 of the protective film 16 rather than to the front side 4 of the wafer 2. Alternatively, a coating of the water-soluble material 22 may be applied to the front side 4 of the wafer 2 and a coating of the water-soluble material 22 may be applied to the front surface 18 of the protective film 16.

Further, the protective film 16 may be provided with an adhesive layer 24 which is present only in a peripheral area of the front surface 18 of the protective film 16 in the same manner as detailed above for the method according to the modification of the first embodiment (see FIG. 4). Moreover, the arrangement of the adhesive layer 24 and/or the arrangement of the water-soluble material 22 can be modified, e.g., in the ways detailed above in relation to the modification of the first embodiment.

In the methods according to the first to third embodiments described above, the protective film 16 is applied and attached to the front side 4 of the substrate, i.e., the wafer 2. However, in other embodiments of the present invention, the protective film may be applied and attached to the back side of the substrate.

The invention claimed is:

1. A method of processing a substrate, having one side and a side being opposite to the one side, wherein the method comprises:
    providing a protective film having a front surface and a back surface opposite to the front surface;
    applying a coating of a water-soluble material to at least a central area of the front surface of the protective film and/or applying a coating of a water-soluble material to at least a central portion of the one side of the substrate;
    after applying the coating to the protective film and/or applying the coating to the substrate, applying the protective film to the one side of the substrate, wherein the front surface of the protective film faces the one side of the substrate and the protective film is applied so that no adhesive is present between at least the central area of the front surface of the protective film and the one side of the substrate;
    applying an external stimulus to the protective film during and/or after applying the protective film to the one side of the substrate, so that the protective film is attached to the one side of the substrate; and
    processing the one side of the substrate and/or the side of the substrate being opposite to the one side.

2. A method of processing a substrate, having one side and a side being opposite to the one side, wherein the method comprises:
    providing a protective film having a front surface and a back surface opposite to the front surface, wherein the protective film has a coating of a water-soluble material applied to at least a central area of the front surface of the protective film;
    applying the protective film to the one side of the substrate, wherein the front surface of the protective film faces the one side of the substrate and the protective film is applied so that no adhesive is present between at least the central area of the front surface of the protective film and the one side of the substrate;
    applying an external stimulus to the protective film during and/or after applying the protective film to the one side of the substrate, so that the protective film is attached to the one side of the substrate; and
    processing the one side of the substrate and/or the side of the substrate being opposite to the one side.

3. The method according to claim 1, wherein the coating applied to the protective film and/or the coating applied to the substrate has a thickness in the range of 0.5 to 5 µm.

4. The method according to claim 1, further comprising removing the protective film from the substrate after processing the one side of the substrate and/or the side of the substrate being opposite to the one side.

5. The method according to claim 4, further comprising, after removing the protective film from the substrate, cleaning the one side of the substrate with water.

6. The method according to claim 1, wherein the protective film is provided with an adhesive layer, the adhesive layer is provided only in a peripheral area of the front surface of the protective film, the peripheral area surrounding the central area of the front surface of the protective film, and the protective film is applied to the one side of the substrate so that the adhesive layer comes into contact only with a peripheral portion of the one side of the substrate.

7. The method according to claim 1, wherein applying the external stimulus to the protective film comprises heating the protective film and/or cooling the protective film and/or applying pressure to the protective film and/or irradiating the protective film with light or UV radiation.

8. The method according to claim 1, wherein the protective film is made of a polyolefin.

* * * * *